United States Patent
Hoglund

(10) Patent No.: US 10,076,064 B2
(45) Date of Patent: Sep. 11, 2018

(54) HOUSING HAVING CONFIGURABLE AIRFLOW EXHAUST

(71) Applicant: Eaton Corporation, Cleveland, OH (US)

(72) Inventor: Justin Raymond Hoglund, Wake Forest, NC (US)

(73) Assignee: Eaton Intelligent Power Limited, Dublin (IE)

( * ) Notice: Subject to any disclaimer, the term of this patent is extended or adjusted under 35 U.S.C. 154(b) by 992 days.

(21) Appl. No.: 13/687,517

(22) Filed: Nov. 28, 2012

(65) Prior Publication Data

US 2014/0148087 A1 May 29, 2014

(51) Int. Cl.
*H05K 5/00* (2006.01)
*H05K 7/20* (2006.01)
*B23P 11/00* (2006.01)

(52) U.S. Cl.
CPC .......... *H05K 7/20554* (2013.01); *B23P 11/00* (2013.01); *H05K 7/20572* (2013.01); *Y10T 29/49826* (2015.01)

(58) Field of Classification Search
CPC .. H05K 7/20554; H05K 7/20572; B23P 11/00
USPC ................. 454/184, 187, 193, 237, 62, 902; 312/223.2, 285
See application file for complete search history.

(56) References Cited

U.S. PATENT DOCUMENTS

| | | | |
|---|---|---|---|
| 2,715,359 A * | 8/1955 | Mackintosh et al. | 454/61 |
| 2,975,227 A * | 3/1961 | Wiater | H05K 5/04 174/559 |
| 4,903,685 A | 2/1990 | Melink | |
| 5,559,673 A * | 9/1996 | Gagnon | G06F 1/20 165/122 |
| 6,026,891 A | 2/2000 | Fujiyoshi et al. | |
| 6,037,732 A | 3/2000 | Alfano et al. | |
| 6,398,505 B1 | 6/2002 | Sekiguchi | |
| 6,463,891 B2 | 10/2002 | Algrain et al. | |

(Continued)

FOREIGN PATENT DOCUMENTS

| GB | 2478779 | 9/2011 |
|---|---|---|
| JP | H0529782 A | 2/1993 |

(Continued)

OTHER PUBLICATIONS

The International Search Report and Written Opinion for Int'l Appln. PCT/US2013/071564, filed, Nov. 25, 2013, dated Apr. 3, 2014.

(Continued)

*Primary Examiner* — Vivek Shirsat

(74) *Attorney, Agent, or Firm* — Benesch Friedlander Coplan & Aronoff LLP

(57) ABSTRACT

A configurable housing includes a top surface having a closed configuration and an opened configuration in which a first plurality of perforations provide a first air flow path. The housing further includes a plurality of sidewalls connected to the top surface. The plurality of sidewalls including a first sidewall having a closed configuration and an opened configuration in which a second plurality of perforations provide a second air flow path. The housing also includes a bottom surface connected to the plurality of sidewalls.

14 Claims, 3 Drawing Sheets

(56) References Cited

U.S. PATENT DOCUMENTS

| | | | |
|---|---|---|---|
| 6,494,779 B1 * | 12/2002 | Nicolai | H02B 1/565 |
| | | | 174/16.1 |
| 6,611,427 B1 | 8/2003 | Wong | |
| 6,623,538 B2 * | 9/2003 | Thakur | B01D 46/0023 |
| | | | 454/187 |
| 7,331,532 B2 | 2/2008 | Currie et al. | |
| 7,438,638 B2 * | 10/2008 | Lewis et al. | 454/184 |
| 8,237,386 B2 | 8/2012 | Culbert et al. | |
| 2006/0006246 A1 | 1/2006 | Kim et al. | |
| 2008/0266789 A1 | 10/2008 | Hruby et al. | |
| 2010/0092625 A1 | 4/2010 | Finch et al. | |
| 2010/0110626 A1 * | 5/2010 | Schmitt | H05K 7/20745 |
| | | | 361/679.47 |
| 2010/0144265 A1 * | 6/2010 | Bednarcik et al. | 454/184 |
| 2011/0175505 A1 | 7/2011 | Linhares et al. | |
| 2012/0153785 A1 * | 6/2012 | Lai | B65D 5/4204 |
| | | | 312/223.2 |

FOREIGN PATENT DOCUMENTS

| | | |
|---|---|---|
| JP | 2003193994 | 7/2003 |
| JP | 2008018497 | 1/2008 |

OTHER PUBLICATIONS

Eaton Corporation Data Center Products; Airflow Management Solutions; the Optimized Data Center; 2011.

* cited by examiner

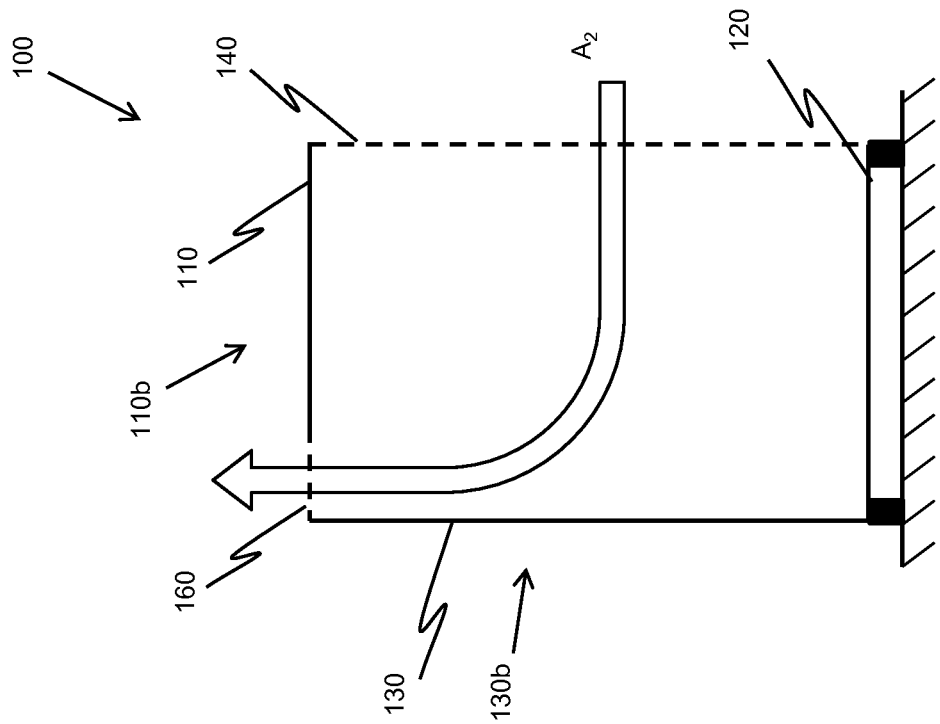
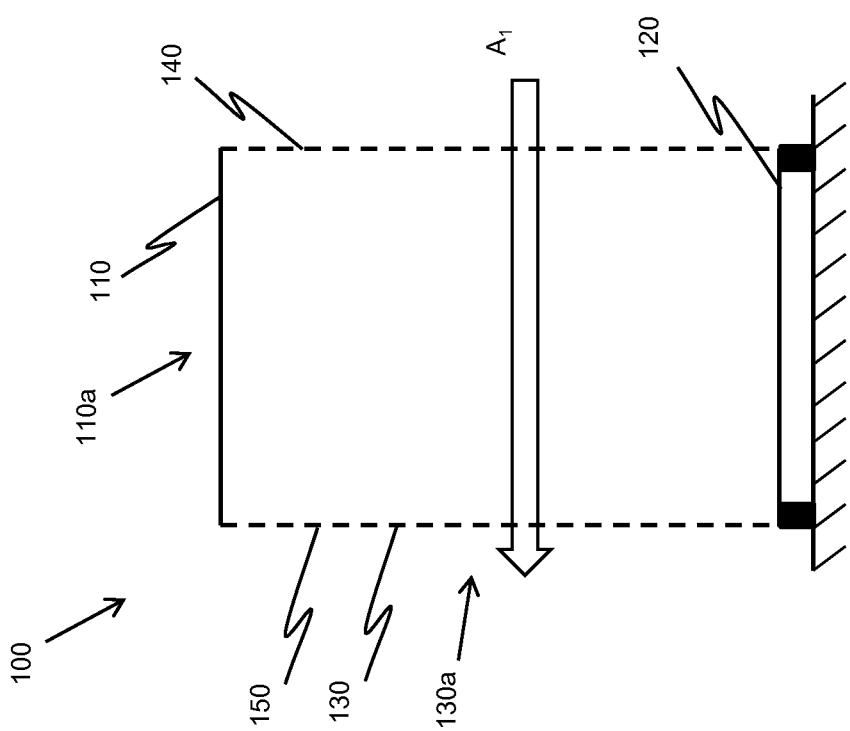

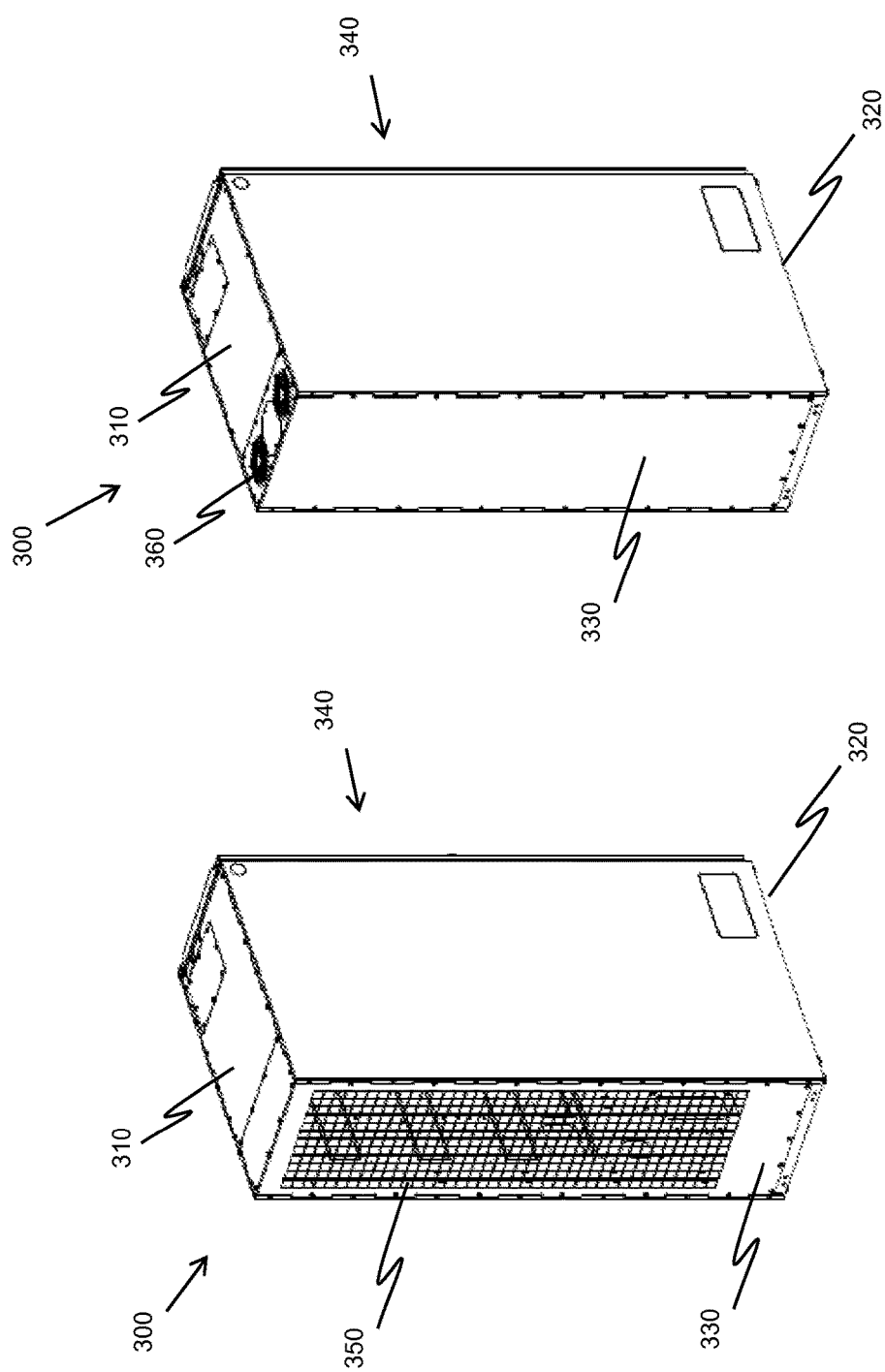

HOUSING HAVING CONFIGURABLE AIRFLOW EXHAUST

FIELD OF INVENTION

The present disclosure relates to a housing for articles that require cooling. More particularly, the present disclosure relates to a housing having a configurable airflow exhaust for articles that require cooling.

BACKGROUND

Cabinets or other housings are used to house electrical equipment and other articles that require cooling. In certain cases, users of the articles prefer to exhaust heated air through the top of the cabinet. For example, the user may desire to place the rear of a cabinet flush against a wall, or near a heat sensitive object. In other cases, users of the articles prefer to exhaust heated air through the rear of the cabinet. For example, the user may desire to space the cabinet away from a wall.

SUMMARY OF THE INVENTION

In one embodiment, a cabinet is configured to house an article that requires cooling. The cabinet includes a top surface having a top air outlet disposed therein, and a removable top cover configured to be secured to the top surface over the top air outlet, thereby obstructing air flow through the top air outlet. The cabinet also includes a plurality of walls connected to the top surface. The plurality of walls include a rear wall having a rear air outlet disposed therein. The cabinet further includes a removable rear cover configured to be secured to the rear wall over the rear air outlet, thereby obstructing air flow through the rear air outlet.

In another embodiment, a housing includes a frame and a first top panel connected to the frame. The first top panel has a top opening disposed therein. The housing also has a second top panel, wherein the second top panel is solid. The housing further has a plurality of side panels connected to the frame. The plurality of side panels include at least a first rear panel and a second rear panel. The first rear panel has a rear opening disposed therein, and the second rear panel is a solid panel.

In yet another embodiment, a configurable housing includes a top surface having a closed configuration and an opened configuration in which a first plurality of perforations provide a first air flow path. The housing further includes a plurality of sidewalls connected to the top surface. The plurality of sidewalls including a first sidewall having a closed configuration and an opened configuration in which a second plurality of perforations provide a second air flow path. The housing also includes a bottom surface connected to the plurality of sidewalls.

In still another embodiment, a method of configuring a housing includes providing a housing having a top surface with a closed configuration and an opened configuration, and a plurality of sidewalls connected to the top surface. The plurality of sidewalls include a first sidewall having a closed configuration and an opened configuration. The method further includes placing a first one of the top surface and the first sidewall in the opened configuration, and placing a second one of the top surface and the first sidewall in the closed configuration.

BRIEF DESCRIPTION OF DRAWINGS

In the accompanying drawings, structures are illustrated that, together with the detailed description provided below, describe exemplary embodiments of the claimed invention. Like elements are identified with the same reference numerals. It should be understood that elements shown as a single component may be replaced with multiple components, and elements shown as multiple components may be replaced with a single component. The drawings are not to scale and the proportion of certain elements may be exaggerated for the purpose of illustration.

FIG. 1 is a schematic drawing illustrating a side view of one embodiment of a housing 100 in a first configuration;

FIG. 2 is a schematic drawing illustrating a side view of the housing 100 in a second configuration;

FIG. 5 is a perspective view of another specific embodiment of a housing 300 in a first configuration; and FIG. 6 is a perspective view of the housing 300 in a second configuration.

DETAILED DESCRIPTION

Figure 4:
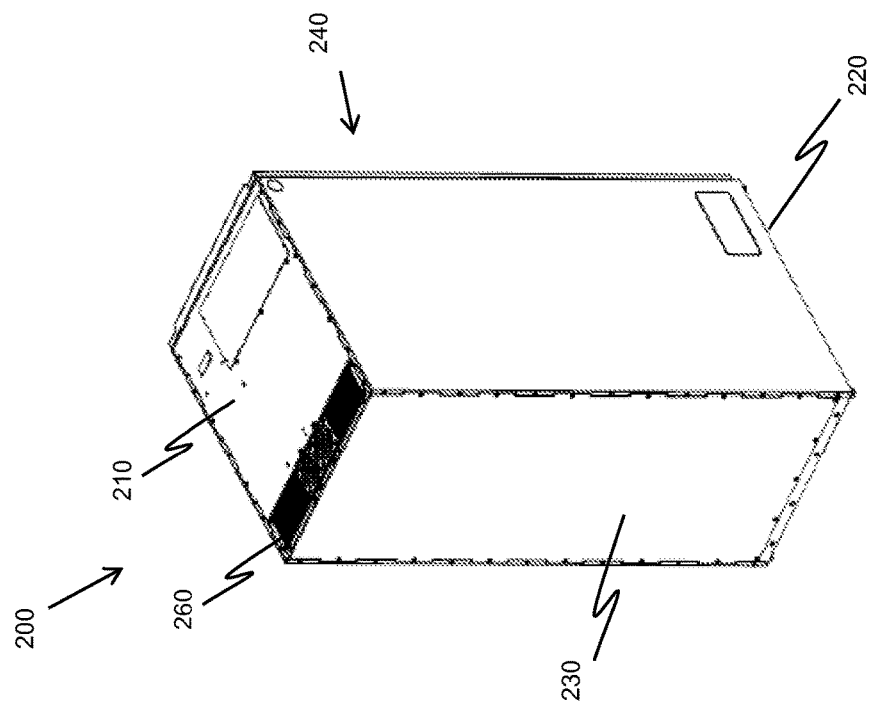
FIG. 4 is a perspective view of the housing 200 in a second configuration.

FIG. 1 is a schematic drawing illustrating a side view of a housing 100 in a first configuration. The housing 100 is configured to house an article (not shown) that may require cooling. The housing 100 includes a top surface 110, a bottom surface 120, and a plurality of sidewalls connected to the top surface 110 and bottom surface 120. The plurality of sidewalls includes a first sidewall 130 that may be used as a rear sidewall of the housing. Therefore, the first sidewall 130 may be referred to as a rear sidewall. However, it should be understood that the orientation of the housing may be changed, and any description of a rear sidewall is not meant to limit the housing to any particular orientation.

The housing 100 also includes an air inlet 140. In the illustrated embodiment, the air inlet 140 is disposed opposite the first sidewall 130. In alternative embodiments (not shown), the air inlet may be disposed at the bottom of the housing, or any of the sides. In one embodiment, the air inlet 140 comprises one or more apertures in a panel of the housing 100. For example, the air inlet may be formed by a plurality of perforations in a panel. Alternatively, the air inlet 140 may be formed by completely omitting a sidewall or the bottom surface.

In the first configuration shown in FIG. 1, the top surface 110 is in a closed configuration 110a and the first sidewall 130 is in an opened configuration 130a. The opened configuration of the first sidewall 130 is caused by the exposure of a side air outlet 150 in the first sidewall 130. The first configuration results in a first air flow $A_1$ from the air inlet 140 through the side air outlet 150.

The side air outlet 150 includes one or more apertures in the first sidewall 130. In one specific embodiment, the side air outlet 150 includes a plurality of perforations in the first sidewall 130. Although the illustrated embodiment shows the side air outlet 150 extending along the entire height of the first sidewall 130, it should be understood that the side air outlet may have any dimensions and take any shape.

FIG. 2 is a schematic drawing illustrating a side view of the housing 100 in a second configuration. The components of the housing 100 remain the same. However, in the second configuration, the top surface 110 is in an opened configuration 110b and the first sidewall 130 is in a closed configuration 130b. The opened configuration of the top surface 110 is caused by the exposure of a top air outlet 160 in the top surface 110. The second configuration results in a second air flow $A_2$ from the air inlet 140 through the top air outlet 160.

The top air outlet 160 includes one or more apertures in the top surface 110. In one specific embodiment, the top air outlet 160 includes a plurality of perforations in the top surface 110. Although the illustrated embodiment shows the top air outlet 160 extending along a small portion of the top surface 110, it should be understood that the side air outlet may have any dimensions and take any shape.

In a first embodiment of the housing 100 shown in FIGS. 1 and 2, the top surface 110 and bottom surface 120 are fixedly connected to the plurality of sidewalls. The fixed connections may be permanent (e.g. through riveting, welding, brazing, etc.) or not permanent (e.g. through screws, nuts and bolts, etc.). The top surface 110 and bottom surface 120 may be directly connected to the plurality of sidewalls 130, or they may be connected via a frame of the housing (not shown).

In the first embodiment, the top surface 110 always includes the top air outlet 160 and the first sidewall 130 always includes the side air outlet 150. The housing 100 may be converted to the first configuration shown in FIG. 1 by securing a cover (not shown) to the top surface 110, over the top air outlet 160, thereby obstructing air flow through the top air outlet 160. The housing 100 may be converted to the second configuration shown in FIG. 2 by securing a cover (not shown) to the first sidewall 130, over the side air outlet 150, thereby obstructing air flow through the side air outlet 150.

In a second embodiment of the housing 100 shown in FIGS. 1 and 2, at least a portion of the top surface 110 is removably connected to the plurality of sidewalls. Likewise, at least a portion of the first sidewall 130 is removably connected to the top surface 110 and the bottom surface 120. The top surface 110 and bottom surface 120 may be directly connected to the plurality of sidewalls 130, or they may be connected via a frame of the housing (not shown).

In the second embodiment, the top surface 110 includes a first, solid top surface, and a second top surface having the top air outlet disposed therein. Likewise, the first sidewall 130 includes a first, solid sidewall, and a second sidewall having the side air outlet disposed therein. The housing 100 may be converted to the first configuration shown in FIG. 1 by securing the first, solid top surface and the second sidewall to the housing 100. In the first configuration, the second top surface, and the first, solid sidewall are not employed.

The housing 100 may be converted to the second configuration shown in FIG. 2 by securing the second top surface and the first, solid sidewall to the housing 100. In the second configuration, the first, solid top surface, and the second sidewall are not employed.

In one embodiment, the housing 100 is a cabinet for housing electronic equipment. In such an embodiment, the housing may include shelves, or other fixtures for securing the equipment. The housing 100 may be constructed of sheet steel, aluminum, or other metals. Alternatively, the housing 100 may be constructed of a polymeric material. It should be understood that the components of the housing may be constructed of the same or different materials.

In one embodiment, one or more exhaust fans may be employed to control the air flow. Although various air inlets and air outlets are described above, it should be understood that the direction of the airflow may be reversed. Accordingly, what is described as an air inlet may function as an air outlet. Likewise, what is described as an air outlet may function as an air inlet. Therefore, the terms "inlet" and "outlet" should not be taken as limiting the direction of airflow.

Figure 3:
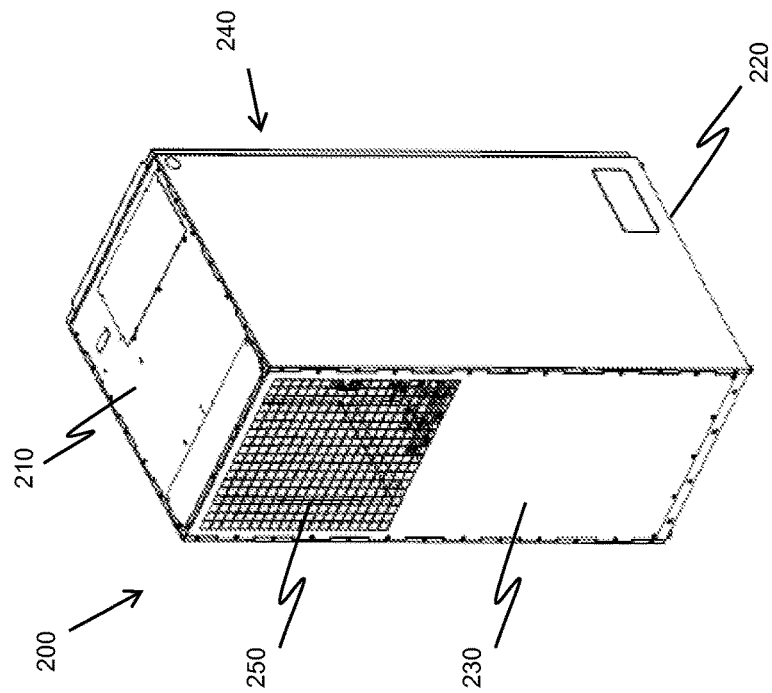
FIG. 3 is a perspective view of one specific embodiment of a housing 200 in a first configuration.

FIGS. 3 and 4 are perspective views of one embodiment of a housing 200 in a first and second configuration, respectively. The housing 200 is one specific embodiment of the housing 100 and functions in the same manner.

The housing 200 includes a top surface 210, a bottom surface 220, and a plurality of sidewalls connected to the top surface 210. The plurality of sidewalls includes a first sidewall 230 that may be used as a rear sidewall of the housing. The housing 200 also includes an air inlet 240. In the illustrated embodiment, the air inlet 240 is disposed opposite the first sidewall 230. In alternative embodiments (not shown), the air inlet may be disposed at the bottom of the housing, or any of the sides. In one embodiment, the air inlet 240 is one or more apertures in a panel of the housing 200. Alternatively, the air inlet 240 may be formed by omitting a sidewall or the bottom surface completely.

The housing further includes a side air outlet 250 and a top air outlet 260. The air outlets 250, 260 are shown as perforations in square or rectangular formations. However, it should be understood that the perforations may be in any formation and have any dimension. In an alternative embodiment (not shown), the air outlets may be a single aperture.

The housing 200 may be converted to the first configuration or the second configurations by the various manners described above with reference to the housing 100 shown in FIGS. 1 and 2. Likewise, the housing 200 includes the same alternative embodiments discussed above with reference to the housing 100.

FIGS. 5 and 6 are perspective views of an alternative embodiment of a housing 300 in a first and second configuration, respectively. The housing 300 is one specific embodiment of the housing 100 and functions in the same manner.

The housing 300 includes a top surface 310, a bottom surface 320, and a plurality of sidewalls connected to the top surface 310. The plurality of sidewalls includes a first sidewall 330 that may be used as a rear sidewall of the housing. The housing 300 also includes an air inlet 340. In the illustrated embodiment, the air inlet 340 is disposed opposite the first sidewall 330. In alternative embodiments (not shown), the air inlet may be disposed at the bottom of the housing, or any of the sides. In one embodiment, the air inlet 340 is one or more apertures in a panel of the housing 300. Alternatively, the air inlet 340 may be formed by omitting a sidewall or the bottom surface completely.

The housing further includes a side air outlet 350 and a top air outlet 360. The side air outlet 350 is shown as a plurality of perforations in a rectangular formation, and the top air outlet 360 is shown as a plurality of perforations in a pair of circular formations. However, it should be understood that the perforations may be in any formation and have any dimension. In an alternative embodiment (not shown), the air outlets may be a single aperture.

The housing 300 may be converted to the first configuration or the second configurations by the various manners described above with reference to the housing 100 shown in FIGS. 1 and 2. Likewise, the housing 300 includes the same alternative embodiments discussed above with reference to the housing 100.

To the extent that the term "includes" or "including" is used in the specification or the claims, it is intended to be inclusive in a manner similar to the term "comprising" as that term is interpreted when employed as a transitional word in a claim. Furthermore, to the extent that the term "or"

is employed (e.g., A or B) it is intended to mean "A or B or both." When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995). Also, to the extent that the terms "in" or "into" are used in the specification or the claims, it is intended to additionally mean "on" or "onto." Furthermore, to the extent the term "connect" is used in the specification or claims, it is intended to mean not only "directly connected to," but also "indirectly connected to" such as connected through another component or components.

While the present application has been illustrated by the description of embodiments thereof, and while the embodiments have been described in considerable detail, it is not the intention of the applicants to restrict or in any way limit the scope of the appended claims to such detail. Additional advantages and modifications will readily appear to those skilled in the art. Therefore, the application, in its broader aspects, is not limited to the specific details, the representative apparatus and method, and illustrative examples shown and described. Accordingly, departures may be made from such details without departing from the spirit or scope of the applicant's general inventive concept.

What is claimed is:

1. A cabinet configured to house electrical equipment that requires cooling, the cabinet comprising:
   a frame; and
   a plurality of panels connected to the frame and defining an air inlet, wherein the plurality of panels includes a top panel and a rear wall;
   wherein the top panel is one of a pair of top panels that are removably connectable to the frame as replacements for one another, including a first top panel that is free of a top air outlet and a second top panel that has a top air outlet;
   wherein the rear wall is one of a pair of rear walls that are removably connectable to the frame as replacements for one another, including a first rear wall that is free of a rear air outlet and a second rear wall that has a rear air outlet;
   whereby the cabinet can be configured with a first air flow path from the air inlet to the rear air outlet by connecting the first top panel and the second rear wall to the frame, and can be converted to an alternative configuration having a second air flow path from the air inlet to the top air outlet by connecting the second top panel and the first rear wall to the frame as replacements for the first top panel and the second rear wall.

2. The cabinet of claim 1, and further comprising an exhaust fan.

3. The cabinet of claim 1, wherein the air inlet is a front air inlet located opposite the rear wall.

4. The cabinet of claim 1, wherein the air inlet is a bottom air inlet located opposite the top panel.

5. The cabinet of claim 1, wherein the top air outlet includes a plurality of perforations in the second top panel.

6. The cabinet of claim 1, wherein the rear air outlet includes a plurality of perforations in the second rear wall.

7. The cabinet of claim 1, wherein the plurality of panels further includes a bottom panel.

8. A cabinet configured to house electrical equipment that requires cooling, the cabinet comprising:
   a plurality of interconnected panels, wherein the plurality of interconnected panels includes a top panel, a rear wall, and an inlet panel defining an air inlet;
   wherein the top panel is one of a pair of top panels that are removably connectable in the plurality of interconnected panels as replacements for one another, including a first top panel that is free of a top air outlet and a second top panel that has a top air outlet;
   wherein the rear wall is one of a pair of rear walls that are removably connectable in the plurality of interconnected panels as replacements for one another, including a first rear wall that is free of a rear air outlet and a second rear wall that has a rear air outlet;
   whereby the cabinet can be configured with a first air flow path from the air inlet to the rear air outlet by connecting the first top panel and the second rear wall in the plurality of interconnected panels, and can be converted to an alternative configuration having a second air flow path from the air inlet to the top air outlet by connecting the second top panel and the first rear wall in the plurality of interconnected panels as replacements for the first top panel and the second rear wall.

9. The cabinet of claim 8, and further comprising an exhaust fan.

10. The cabinet of claim 8, wherein the air inlet is a front air inlet located opposite the rear wall.

11. The cabinet of claim 8, wherein the air inlet is a bottom air inlet located opposite the top panel.

12. The cabinet of claim 8, wherein the top air outlet includes a plurality of perforations in the second top panel.

13. The cabinet of claim 8, wherein the rear air outlet includes a plurality of perforations in the second rear wall.

14. The cabinet of claim 8, wherein the plurality of panels further includes a bottom panel.

* * * * *